United States Patent [19]
Koh

[11] Patent Number: 5,770,506
[45] Date of Patent: Jun. 23, 1998

[54] METHOD OF FABRICATING A FIELD EFFECT TRANSISTOR WITH SHORT GATE LENGTH

[75] Inventor: Risho Koh, Tokyo, Japan

[73] Assignee: NEC Corporation, Tokyo, Japan

[21] Appl. No.: 881,749

[22] Filed: Jun. 24, 1997

Related U.S. Application Data

[60] Continuation of Ser. No. 446,062, May 19, 1995, abandoned, which is a division of Ser. No. 191,291, Feb. 3, 1994, abandoned.

[30] Foreign Application Priority Data

Feb. 4, 1993 [JP] Japan ...................................... 5-16660

[51] Int. Cl.$^6$ .................................................. H01L 21/336
[52] U.S. Cl. ......................... 438/303; 438/304; 438/305
[58] Field of Search ......................... 437/41 SW, 40 SW, 437/44, 43; 438/303, 304, 305, 306, 307

[56] References Cited

U.S. PATENT DOCUMENTS

| | | | |
|---|---|---|---|
| 4,745,079 | 5/1988 | Pfiester | 438/306 |
| 4,978,626 | 12/1990 | Poon et al. | 437/44 |
| 5,019,879 | 5/1991 | Chin | 437/43 |
| 5,061,647 | 10/1991 | Roth et al. | |
| 5,164,805 | 11/1992 | Lee | |
| 5,202,277 | 4/1993 | Kameyama et al. | 437/41 |
| 5,217,913 | 6/1993 | Watabe et al. | 437/44 |
| 5,405,791 | 4/1995 | Ahmad et al. | 437/34 |
| 5,443,996 | 8/1995 | Lee et al. | 437/200 |
| 5,512,506 | 4/1996 | Chang et al. | 438/306 |
| 5,547,885 | 8/1996 | Ogoh | 438/305 |

FOREIGN PATENT DOCUMENTS

| | | |
|---|---|---|
| 64-86559 | 3/1989 | Japan . |
| 64-89461 | 4/1989 | Japan . |
| 2-137372 | 5/1990 | Japan . |
| 3-227652 | 10/1991 | Japan . |
| 5-315605 | 11/1993 | Japan . |

OTHER PUBLICATIONS

Wolf et al., *Silicon Processing For The VLSI Era*, vol. II, Lattice Press, 1990, pp. 144–150, 167–169, 354–359, 434–441.

Ogura, S., et al., "A Half Micron MOSFET Using Double Implanted LDD", *IEEE*, 1982, pp. 718–720.

*Primary Examiner*—Charles L. Bowers, Jr.
*Assistant Examiner*—Lynne A. Gurley
*Attorney, Agent, or Firm*—Young & Thompson

[57] ABSTRACT

On a silicon substrate in which boron (B) has been introduced, an n$^+$ polysilicon film and a tungsten silicide film are sequentially deposited, with a gate oxide film being interposed between the substrate and the polysilicon film, to form a gate electrode. A sidewall of p$^+$ polysilicon is formed at each side of said gate electrode. A source/drain diffusion layer of an n$^+$ region is self-aligned with a side edge portion of the gate electrode including the sidewall. The formation of the sidewall is performed after the source/drain diffusion layers have been formed using a dummy sidewall. The gate structure thus formed has a steep potential gradient in the lateral direction of channel region. In the field effect transistor thus formed, the short channel effect is efficiently suppressed.

10 Claims, 5 Drawing Sheets

METHOD OF FABRICATING A FIELD EFFECT TRANSISTOR WITH SHORT GATE LENGTH

This application is a continuation of application Ser. No. 08/446,062, filed May 19, 1995, which is a division of Ser. No. 08/191,291, filed Feb. 3, 1994, now abandoned.

BACKGROUND OF THE INVENTION (1) Field of the invention

The present invention relates to a field effect transistor, and more particularly to a field effect transistor (FET) in which the reduction of gate length is necessary and which is adapted to applications in fields requiring the transistor to be highly integrated and to have high speed performance as memories and logic circuits, and a method for fabricating such a field effect transistor.

For purposes of suppressing short channel effects which occur more as the field effect transistors are further miniaturized and scaled down, there has been proposed a method for pocket-ion implantation wherein the impurities of the same type as and of higher concentration than that of the substrate are introduced into a junction between source/drain regions. The structure resulted from such proposal (shown in FIG. 1) is described, for example, in a report by S. Ogura entitled "A HALF MICRON MOSFET USING DOUBLE IMPLANTED LDD". IEDM Technical Digest. 1982, pages. 718–721. It is proposed that a $p^+$ region 20 is provided below an $n^-$ region 15 for suppressing short channel effects. In FIG. 1, a silicon substrate is designated by numeral 1, a gate oxide film by numeral 2, an $n^+$ polysilicon by numeral 3, a CVD oxide film by numeral 10, a p region by numeral 20, a platinum silicide by numeral 21, and a boron channel by numeral 22.

Also, for purposes of ensuring reliability, there has been proposed a method in which a sidewall of metal or metal silicide is provided at a gate electrode of a field effect transistor. This proposal is described, for example, by M. Konaka in Japanese Patent Application Kokai Publication No. Sho 64-89461 and Japanese Patent Application Kokai Publication No. Sho 64-86559. According to this proposal, a metal region is provided at a portion above $n^-$ region 15 in a gate electrode in order to enhance a longer is life of a lightly doped drain (LDD) field effect transistor.

With respect to the field effect transistor, a potential distribution at the interface between the gate oxide film and the substrate in the n-channel transistor as an example Is as shown in a solid line in FIG. 13 when plotted in the direction from the source to the drain In parallel with the substrate. As the distance between the source and the drain becomes narrower, the potential barrier 51 with respect to carriers becomes narrower and lower, resulting in difficulties in maintaining the potential barrier in short channel transistors. It follows that, in order to maintain the potential barrier 51, it is necessary that the rising of the potential barrier from the source electrode portion be steep.

In performing the pocket-ion implantation, impurities of a second conductivity type are introduced in the vicinity of the source/drain regions formed of the first conductivity type diffusion layer. The ionized second conductivity type impurities prevent the lowering of the potential barrier by the electric fields from both the source and drain electrodes. As a result, the form of the potential barrier becomes steep thereby enabling to provide short channel transistors.

However, when the transistors are further scaled down, the pocket-ion implantation locally introducing impurities encounters difficulties due to diffusion of the impurities.

On the other hand, in the configuration wherein the sidewall is formed of metal or metal sulicide at the gate electrode, if the ion implantation or thermal treatment for the formation of the source/drain regions is performed after the formation of such sidewall, there will be a problem in that the impurities are abnormally diffused through grain boundaries of the metal.

SUMMARY OF THE INVENTION

An object of the present Invention, therefore, is to overcome the problems existing in the prior art as explained above and to provide an improved field effect transistor capable of suppressing short channel effects and a method for fabricating such a transistor.

According to one aspect of the invention, there is provided a field effect transistor of a first conductivity type comprising:

a semiconductor substrate:

a gate insulating film formed on said semiconductor substrate;

a gate electrode formed on said gate insulating film and formed of at least one of said first conductivity type semiconductor and a metal silicide; and a sidewall formed of a second conductivity type polycrystalline semiconductor in contact with and electrically connected to said gate electrode said sidewall having a lower surface directly in contact with an upper surface of said gate insulating film, said sidewall and said gate electrode being formed of materials selected such that the work function of said second conductivity type polycrystalline semiconductor forming said sidewall is larger than a work function of said electrode material in an n-channel transistor and is smaller than the work function of said gate electrode material in a p-channel transistor.

According to another aspect of the invention, there is provided a method for fabricating a field effect transistor of a first conductivity type, the method comprising the steps of:

forming a gate electrode of a polycrystalline semiconductor on an insulating film provided on a semiconductor substrate:

depositing isotropically a spacer material on and around the gate electrode;

forming a dummy spacer sidewall by anisotropically etching back the spacer material;

forming source/drain diffusion layers using the gate electrode and the dummy spacer sidewall as masks;

removing the dummy spacer sidewall after the formation of the source/drain diffusion layers;

depositing lsotropically a material selected from a metal, a metal sulicide and a polycrystalline silicon; and forming a sidewall by anisotropically etching back the deposited material selected from the metal, metal sulicide and polycrystalline silicon, the sidewall being in contact with the gate electrode.

In the arrangement according to the first aspect of the invention (FIGS. 3 and 4), the sidewall formed of the second conductivity type polycrystalline semiconductor is provided at the gate of the field effect transistor of the first conductivity type. This secures or enhances the switching characteristics of the short channel transistor due to the work function difference between the gate electrode and the sidewall.

In the arrangement according to the second aspect of the invention (FIGS. 5–8), the sidewall formed of a material selected from metal and metal silicide is provided at the gate of the field effect transistor of the first conductivity type. This also secures or enhances the switching characteristics of the short channel transistor due to the work function difference between the gate electrode and the sidewall.

In the methods according to the third and fourth aspects of the invention (FIGS. 5–12). the conductive sidewall is attached to the gate electrode after the formation of the source/drain diffusion layers. This avoids the influence to the conductive sidewall from the ion implantation or thermal treatment performed for the formation of the source/drain regions.

BRIEF DESCRIPTION OF THE DRAWINGS

The above and other objects, features and advantages Of the present invention will be apparent from the following description of preferred embodiments of the invention explained with reference to the accompanying drawings, in which.

PREFERRED EMBODIMENTS OF THE INVENTION

Now, preferred embodiments of the invention will be explained hereunder with reference to the accompanying drawings.

Figure 1:
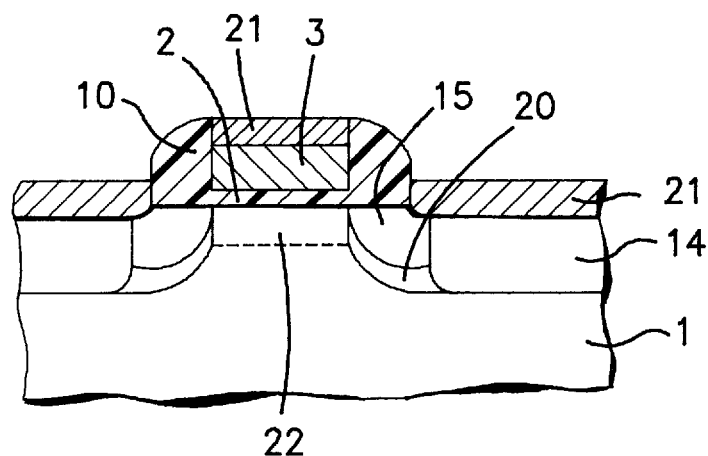
FIG. 1 shows in sectional view example of a conventional FET structure.
Figure 2:
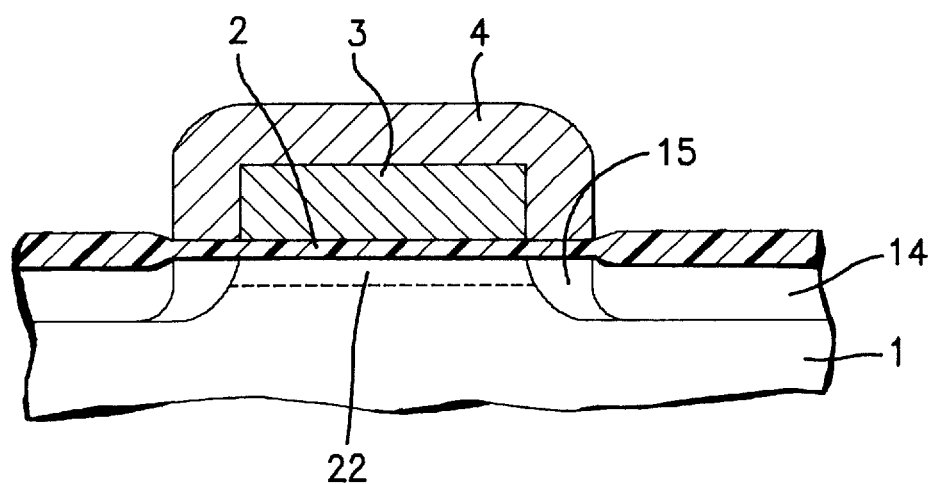
FIG. 2 shows another sectional view another example of a conventional FET structure.
Figure 3:
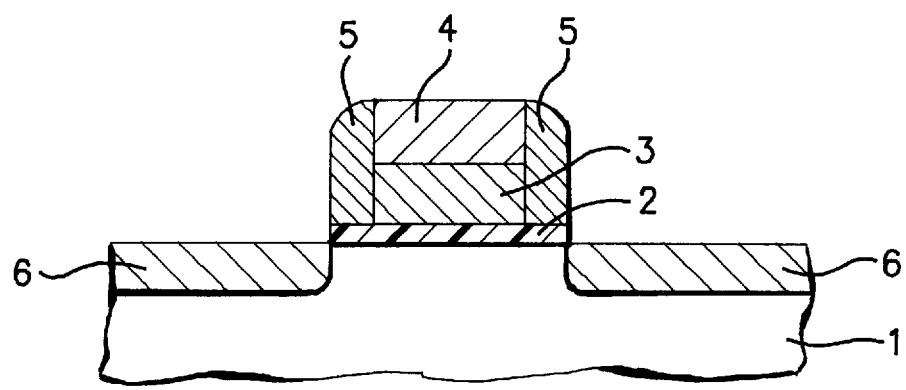
FIG. 3 shows a sectional view FET structure of a first embodiment according to the invention.

FIG. 3 shows in sectional view an FET structure of a first embodiment according to the invention. On a silicon substrate 1 in which boron (B) of $3 \times 10^{17}$ cm$^{-3}$ is introduced, a gate electrode having a width of 0.11 μm is provided by sequentially depositing an n$^+$ polysilicon (also called "polycrystalline silicon") film 3 having a thickness of 0.2 ∞m and a tungsten silicide film 4 having a thickness of 0.2 μm, with a gate oxide film 2 having a thickness of 7 nm being interposed between the substrate 1 and the polysilicon film 3. On each side of the gate electrode, there is provided a sidewall formed of p$^+$ polysilicon and having a width of 20 nm. In the silicon substrate 1, source/drain diffusion layers 6 of an n$^+$ region are formed In such a way that they are self-aligned with the side edges of the gate electrode including the sidewall 5.

Figure 4:
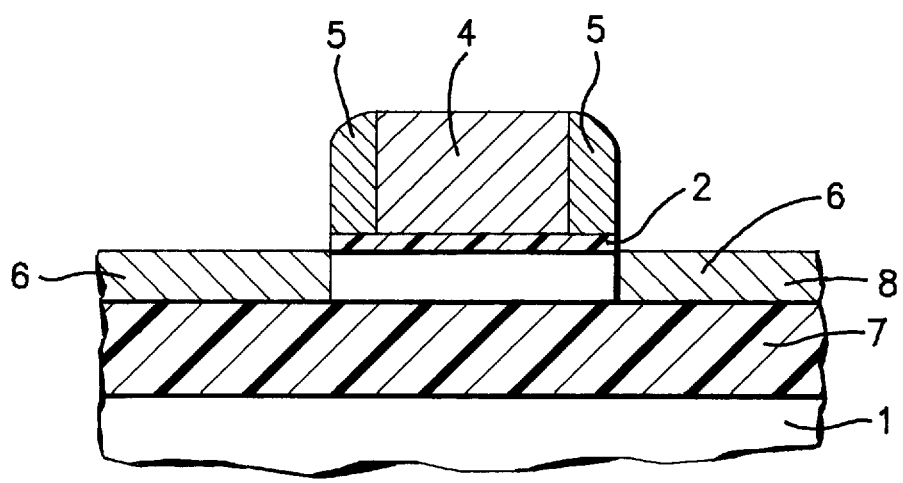
FIG. 4 shows a sectional view an FET structure of a second embodiment according to the invention.

FIG. 4 shows in sectional view an FET structure of a second embodiment of the invention. On a silicon substrate 1, there are provided a buried oxide film 7 having a thickness of 4000 Angstroms and a SOI (silicon-on-insulator) layer 8 having a thickness of 300 Angstroms. On a gate oxide film 2 having a thickness of 70 Angstroms formed on the SOI layer 8, there is provided a rate electrode formed of a tungsten silicide film 4 and having a width of 0.11 μm. On each of the sides of the gate electrode, there is provided a sidewall formed of p$^+$ polysilicon and having a width of 20 nm. In the SOI layer 8, source/drain diffusion layers 6 of an n$^+$ region are formed in such a way that they are self-aligned with the side edges of the gate electrode including the sidewall 5.

Figure 5:
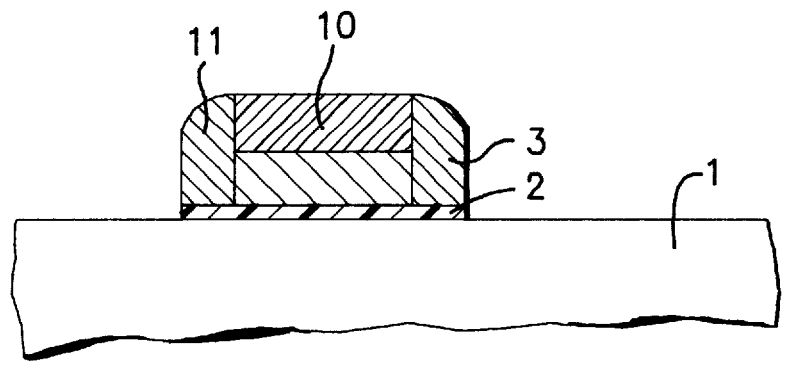
FIGS. 5–8 show in sectional views an FET structure of a third embodiment according to the invention, for explaining the sequential steps for fabricating the same.
Figure 6:
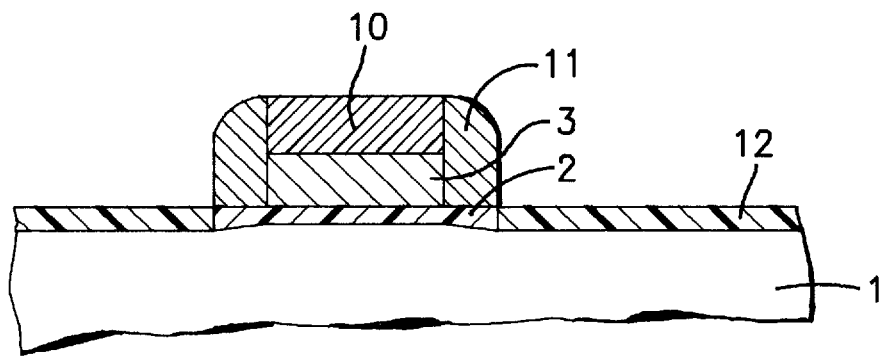
Figure 7:
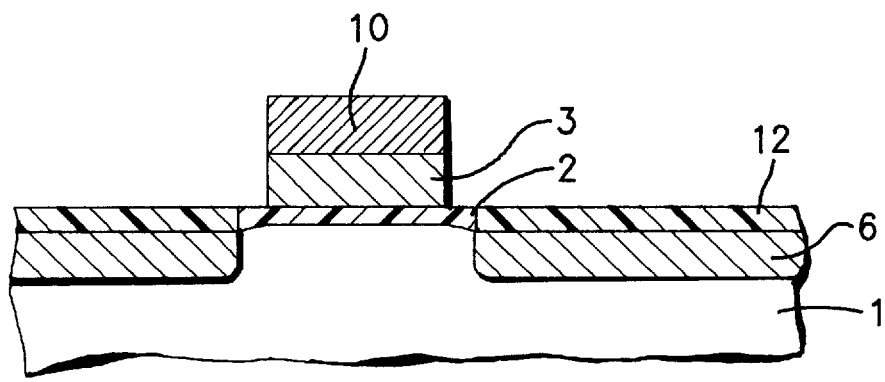
Figure 8:
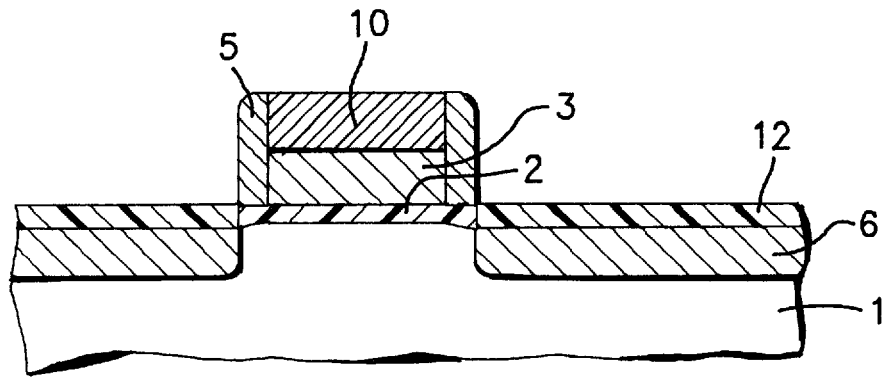

FIGS. 5–8 show, in sectional views, a structure of a third embodiment of the invention. As shown in FIG. 5, on a gate oxide film 2 having a thickness of 7 nm and formed on a silicon substrate 1 in which boron of $3 \times 10^{17}$ cm$^{-3}$ is introduced, there are formed layers by sequentially depositing an n$^+$ polysilicon film 3 having a thickness of 0.2 μm and a CVD-SiO$_2$ film 10 having a thickness of 0.2 μm, and these layers are patterned using an ordinary lithographic process and an anisotropic etching process whereby a gate electrode having a width of 0.11 μm is formed. Thereafter, an Si$_3$N$_4$ is deposited to 1500 Angstroms and this is etched back by anisotropic etching whereby a dummy spacer sidewall 11 is formed at each side of the gate electrode. Then, as shown in FIG. 6, a thermal oxide film 12 having a thickness of 300 Angstroms is formed by a thermal oxidation process in O$_2$ atmosphere under 980° C. on the portion of the silicon substrate 1 that is not covered either by the n$^+$ polysilicon film 3 or the spacer sidewall 11. The portion of the gate oxide film 2 that is located below the dummy spacer 11 becomes slightly thicker due to the influence of the thermal oxidation. Next, ion implantation of arsenic (As) is performed for $10 \times 10^{15}$ cm$^{-2}$ at 70 keV. Then, as seen in FIG. 7, the dummy spacer sidewall 11 is removed by wet etching using phosphoric acid followed by thermal treatment in nitrogen atmosphere of 850° C. for 10 minutes, whereby impurity atoms are activated and the source/drain diffusion layers 6 of an n$^+$ region are formed. In this instance, the arsenic atoms which are n type impurities expand into the n$^+$ polysilicon side from the location defined by the dummy spacer sidewall 11 due to thermal diffusion. Thereafter, as shown in FIG. 8, the tungsten silicide film having a thickness of 200 Angstroms is deposited on the entire surface and, then, is anisotropIcally etched back, whereby a sidewall 5 of the tungsten silicide electrically in contact with the n$^+$ polysilicon film 3 is provided at each side of the gate electrode.

Figure 9:
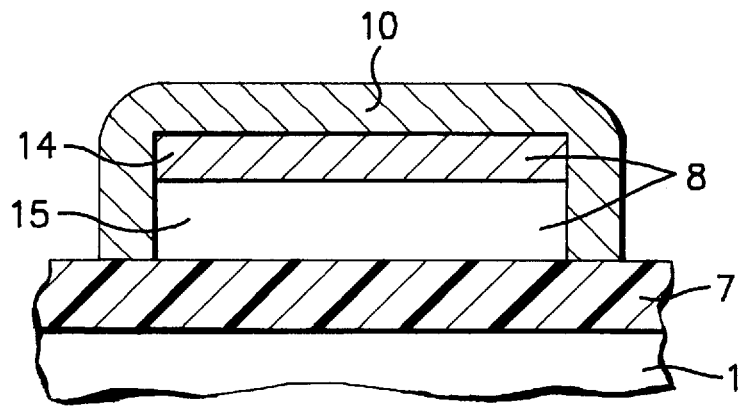
FIGS. 9–12 show in sectional views an FET structure of a fourth embodiment according to the invention, for explaining the sequential steps for fabricating the same.

FIGS. 9–12 show, in sectional views, an FET structure of a fourth embodiment according to the Invention. As seen in FIG. 9, a SOI substrate on a silicon substrate 1 comprises a buried oxide film 7 having a thickness of 4000 Angstroms and a SOI layer 8 having a thickness of 2500 Angstroms. A resist pattern is provided on the region of the SOI layer 8 wherein elements are formed and, with this resist used as a mask, the region wherein the elements are not formed is dry-etched and removed, whereby the region without the elements, that is, an element isolation region, is provided, Then, the Ion implantation of phosphor (P) is performed for $2.0 \times 10^{12}$ cm$^{-2}$ at 120 keV and that of arsenic (As) is performed for $5.0 \times 10^{15}$ cm$^{-2}$ at 70 keV followed by thermal treatment In the nitrogen atmosphere under 850° C. for 10 minutes for purposes of activating the impurities, whereby an n$^+$ region 14 and an n$^-$ region 15 are formed. Then, a CVD oxide film 10 of 1000 Angstroms is deposited by a low-pressure chemical vapor deposition (LP-CVD) process.

Figure 10:
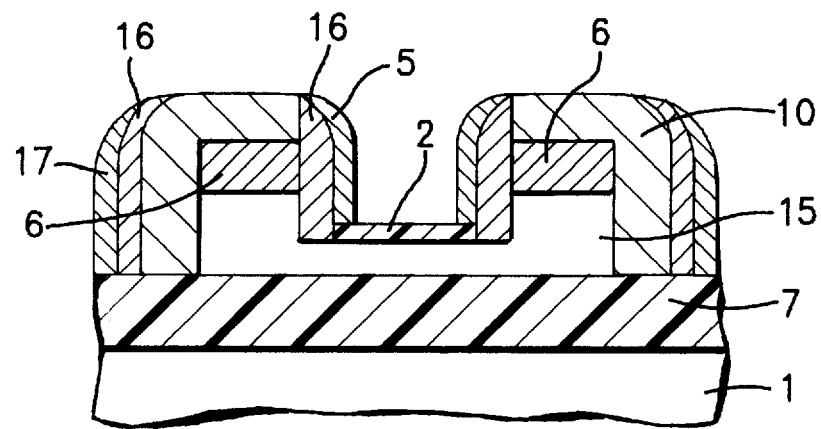
Figure 11:
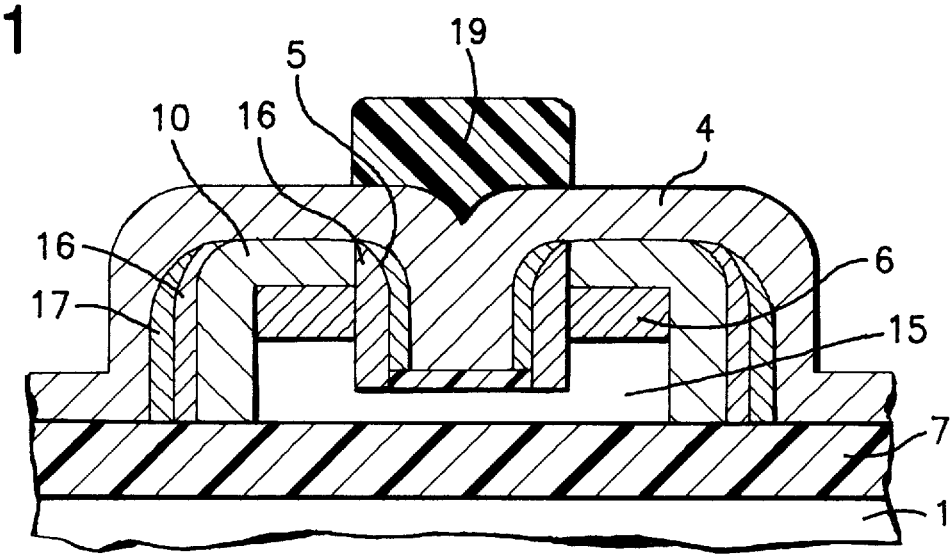
Figure 12:
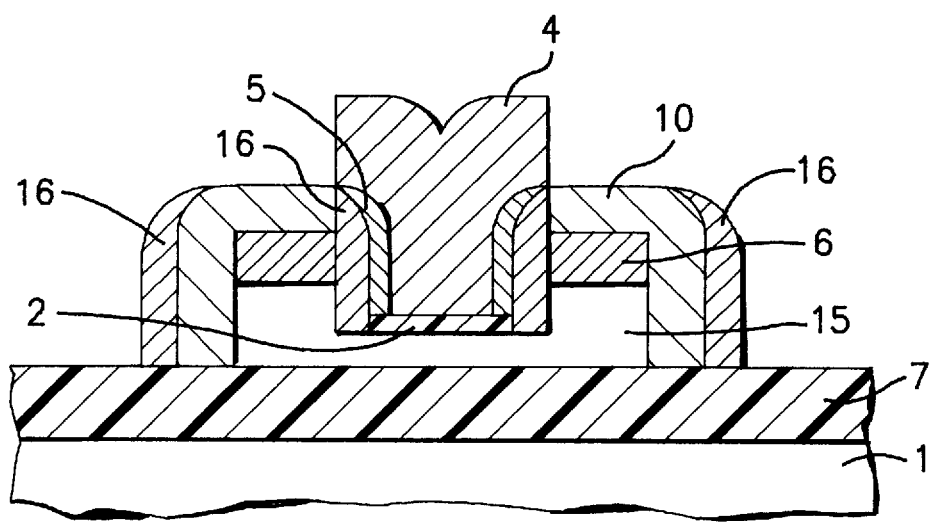

Next, as shown in FIG. 10, by using the resist pattern formed by a lithography process as a mask, the CVD oxide film 10 and the SOI layer 8 at the region (0.25 μm wide) wherein the gate electrode is formed is etched, with the former being etched for 1000 Angstroms and the latter being etched for 2100 Angstroms. This separates the n$^+$ region 14 into two separate source/drain regions. Then, a second CVD oxide film 16 is deposited for 700 Angstroms on the entire surface followed by anisotropical etching of this oxide film for 700 Angstroms. Next, the surface of the SOI layer 8 is subjected to thermal oxidation in the oxygen atmosphere under 850° C. whereby a gate oxide film 2 having a thickness of 100 Angstroms is formed. Then, a p$^+$ polysillcon film of 200 Angstroms is deposited on the entire surface using the LP-CVD process and this polysilicon film is anisotropically etched back thereby to provide a sidewall 5. At this time, a sidewall 17 of the p$^+$ polysilicon is also formed outside the element. Thereafter, as seen in FIG. 11, a tungsten silicide 4 is sputtered for 5000 Angstroms and a resist pattern 19 is provided for the gate-etching by an ordinary lithography process. With this resist pattern 19 used as a mask, the tungsten silicide 4 is etched away. Either simultaneously with this etching or following the etching of the tungsten silicide 4, the sidewall 17 of the p$^+$ polysilicon located outside the element is etched and removed. Then, the resist pattern 19 is etched and removed, which provides the structure as shown in FIG. 12.

In the foregoing description of the various embodiments of the invention, the dimensions, film thicknesses, film formation processes, etc. given are only examples and are in no way restrictive. The substrate may be in a bulk form or in a SOI form. The conductivity type of the transistor is not limited to an n type and may be a p type. Also, the diffusion layer is not limited to that formed by ion-implantation as it may be formed by other processes such as diffusion or epitaxial growth.

It is also to be noted that the structures of the first and second embodiments described above are not limited to those fabricated according to the methods explained. As an example, the source/drain diffusion layers 6 may be provided after the formation of the sidewall 5.

Figure 13:
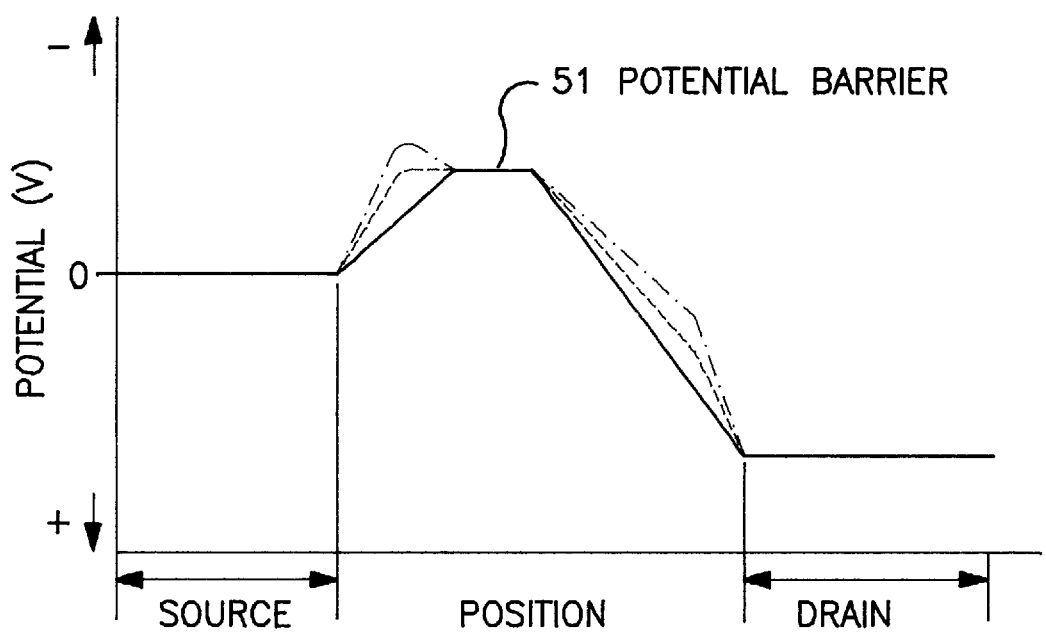
FIG. 13 shows in graphical view potential distributions in the vicinity of the substrate surface in the n-channel field effect transistor.

In the embodiments shown in FIGS. 3–8, the lowering of the potential barrier 51 with respect to the carrier is suppressed by utilizing the work function difference between the gate sidewall and the material constituting the center portion of the gate, whereby the potential gradient at the source junction side is rendered steep. That is, the potential barrier is improved from the shape shown with the solid line in FIG. 13 to that shown with the broken lines or in the alternate long and short dash line. As a result, even in the short channel transistor with closely disposed source/drain regions, it is possible to obtain the potential barriers that are sufficient for switching in the transistor.

The reason for the potential barrier 51 being in the broken line shape is that, when the n-channel transistor is taken as an example, the potential of the sidewall portion is lower than that of the source since the work function of the sidewall portion is larger than that of the center portion of the gate and the lowering of the barrier caused by the electric fields from the source is smaller since the electric lines of force from the source are partially directed to the gate, and this has the effect of making the potential gradient of the potential barrier 51 steep.

The reason for the potential barrier 51 being in the alternate long and short dash line shape is that, when the n-channel transistor is taken as an example, the effect in which the potential of the sidewall portion is made lower than that of the source is great and the steep barrier is formed in a very close vicinity of the source due to the electric field from the sidewall portion.

It is seen that the potential gradient is increased at the drain end but, since the electron current flows through a deep portion of the substrate, this suppresses the reliability deterioration that may be caused by the increase in the potential gradient.

In the SOI transistor, it is not possible to set complex impurity distribution as in pocket-ion implantation for purposes of suppressing short channel effects, so that the application of the invention as in the second embodiment (FIG. 4) is effective.

In the embodiment shown in FIGS. 5–8, where the gate electrode has a p$^+$ sidewall as in the embodiments shown in FIGS. 3 and 4 but such sidewall is provided after the formation of the diffusion layers, the temperature used in the formation of the diffusion layer or the process used in the ion implantation is prevented from giving adverse effects to the impurity profile in the gate electrode. Also, where the gate electrode is provided with a metal or a metal silicide sidewall so as to obtain the effect which may be small but qualitatively similar to that achieved with the p$^+$ sidewall, the temperature used in the formation of the diffusion layers or the process used in the ion-implantation is prevented from giving adverse effects to the metal or metal silicide sidewall or to its interface regions.

The fourth embodiment of the invention described with reference to FIGS. 9–12 provides an advantage, in addition to that achieved by the embodiment shown in FIGS. 5–8 that, even when the material selected from metal and metal silicide is used for the formation of the center portion of the gate, such material is prevented from being affected by processes such as thermal treatment during the formation of the diffusion layers.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a field effect transistor of a first conductivity type, said method comprising the steps of:
    forming a gate electrode of a polycrystalline semiconductor on an insulating film provided on a semiconductor substrate;
    depositing isotropically a spacer material on and around said gate electrode;
    forming a dummy spacer sidewall by anisotropically etching back said spacer material;
    forming source/drain diffusion layers using said gate electrode and said dummy spacer sidewall as masks, said source/drain diffusion layers not extending beneath said gate electrode;
    removing said dummy spacer sidewall after the formation of said source/drain diffusion layers;
    depositing isotropically a material selected from the group consisting of metal, metal silicide and polycrystalline silicon; and
    forming a sidewall by anisotropically etching back said deposited material, said sidewall being formed at regions corresponding to said removed dummy spacer sidewall and being thinner than said dummy spacer sidewall and in contact with said gate electrode.

2. A method for fabricating a field effect transistor according to claim 1, further comprising a step for forming a thermal oxide film on said semiconductor substrate after the step for forming said dummy spacer sidewall.

3. A method for fabricating a field effect transistor according to claim 1, in which said spacer material deposited is Si$_3$N$_4$.

4. A method for fabricating a field effect transistor according to claim 1, in which said material anisotropically etched back to form said sidewall is tungsten silicide.

5. A method of fabricating a field effect transistor, comprising the steps of:

forming a semiconductor gate electrode on an insulating film on a semiconductor substrate;

forming a dummy spacer on sides of the gate electrode, the dummy spacer having a first width;

implanting impurities into the substrate using the gate electrode and the dummy spacer as a mask;

removing the dummy spacer;

diffusing the impurities into the substrate to form source/drain layers; and forming a sidewall on sides of the gate electrode at regions corresponding to the removed dummy spacer, the sidewall having a second width that is less than the first width and comprising a material selected from the group consisting of metal, metal silicide and polycrystalline silicon.

6. The method of claim 5, wherein the first width of the dummy spacer is sufficient so that the subsequently formed sidewall overlies a portion of a channel region in the substrate beneath the gate electrode.

7. The method of claim 5, wherein the first width is sufficient to prevent the impurities from extending beneath the gate electrode when the impurities are diffused into the substrate.

8. The method of claim 5, wherein the first width is about 1500 Å and the second width is about 200Å.

9. A method of fabricating a field effect transistor, comprising the steps of:

forming a semiconductor gate electrode on an insulating film on a semiconductor substrate;

forming a dummy spacer on sides of the gate electrode, the dummy spacer having a first width;

implanting impurities into the substrate using the gate electrode and the dummy spacer as a mask, the first width being sufficient to prevent the impurities from extending beneath the gate electrode when the impurities are diffused into the substrate;

removing the dummy spacer;

diffusing the impurities into the substrate to form source/drain layers which do not extend beneath the gate electrode; and forming a sidewall on sides of the gate electrode at regions corresponding to the removed dummy spacer, the sidewall comprising a material selected from the group consisting of metal, metal silicide and polycrystalline silicon, wherein the sidewall has a second width that is less than the first width.

10. The method of claim 9, wherein the first width of the dummy spacer is sufficient so that the subsequently formed sidewall overlies a portion of a channel region in the substrate beneath the gate electrode.

* * * * *